US012620895B2

(12) United States Patent
La Pila et al.

(10) Patent No.: US 12,620,895 B2
(45) Date of Patent: May 5, 2026

(54) BALANCE SYSTEM TO REGULATE THE VOLTAGE OF THE FLY CAPACITOR OF A THREE-LEVEL BUCK ACTING ON RAMPS

(71) Applicant: STMicroelectronics International N.V., Geneva (CH)

(72) Inventors: Marco La Pila, Gravina di Catania (IT); Giuseppe Platania, Valverde (IT); Placido Salvatore Battiato, Biancavilla (IT)

(73) Assignee: STMicroelectronics International N.V., Geneva (CH)

( * ) Notice: Subject to any disclaimer, the term of this patent is extended or adjusted under 35 U.S.C. 154(b) by 241 days.

(21) Appl. No.: 18/418,760

(22) Filed: Jan. 22, 2024

(65) Prior Publication Data

US 2025/0239931 A1 Jul. 24, 2025

(51) Int. Cl.
H02M 3/07 (2006.01)
H03K 4/06 (2006.01)
H02M 1/00 (2006.01)

(52) U.S. Cl.
CPC ................ H02M 3/07 (2013.01); H03K 4/06 (2013.01); H02M 1/0095 (2021.05)

(58) Field of Classification Search
CPC .... H02M 1/0003; H02M 1/088; H02M 1/322; H02M 3/07; H02M 3/158; H02M 7/4837; H03K 4/06
See application file for complete search history.

(56) References Cited

U.S. PATENT DOCUMENTS

| | | | | |
|---|---|---|---|---|
| 11,973,507 | B2 * | 4/2024 | Leonardo | H03K 5/2481 |
| 2016/0329809 | A1 * | 11/2016 | Granato | H02M 3/158 |
| 2017/0331374 | A1 * | 11/2017 | Høyerby | H03F 3/183 |
| 2018/0262110 | A1 * | 9/2018 | Fukushima | H02M 1/32 |
| 2019/0379287 | A1 | 12/2019 | Zhang et al. | |
| 2021/0067041 | A1 | 3/2021 | Cho et al. | |
| 2021/0159790 | A1 | 5/2021 | Tseng et al. | |
| 2021/0184594 | A1 | 6/2021 | Shen et al. | |
| 2022/0029534 | A1 * | 1/2022 | Chen | H02M 3/158 |
| 2023/0012123 | A1 | 1/2023 | Fan et al. | |
| 2024/0039403 | A1 * | 2/2024 | Ahn | H02M 3/07 |

* cited by examiner

*Primary Examiner* — Jeffrey A Gblende
*Assistant Examiner* — Nicolas Alden Chapa Mills
(74) *Attorney, Agent, or Firm* — Crowe & Dunlevy LLC

(57) ABSTRACT

A three-level DC-DC converter includes a power-stage with high and low-side transistors, a flying capacitor, and an inductor coupled between an output tap of the power-stage and an output node of the converter. A feedback-divider is coupled in parallel with an output capacitor between the output node and ground and generates a feedback-voltage. A ramp-generator generates a first ramp-signal based on a constant reference-voltage and generates a second ramp-signal based on a difference between a voltage across the flying capacitor and one-half the input-voltage. Control-circuitry generates an error-signal based on a comparison between the feedback-voltage and a reference, generates a first high-side control-signal and a first low-side control-signal for the power-stage, based on a comparison between the first ramp-signal and the error-signal, and generates a second high-side control-signal and a second low-side control-signal for the power-stage, based on a comparison between the second ramp-signal and the error-signal.

16 Claims, 5 Drawing Sheets

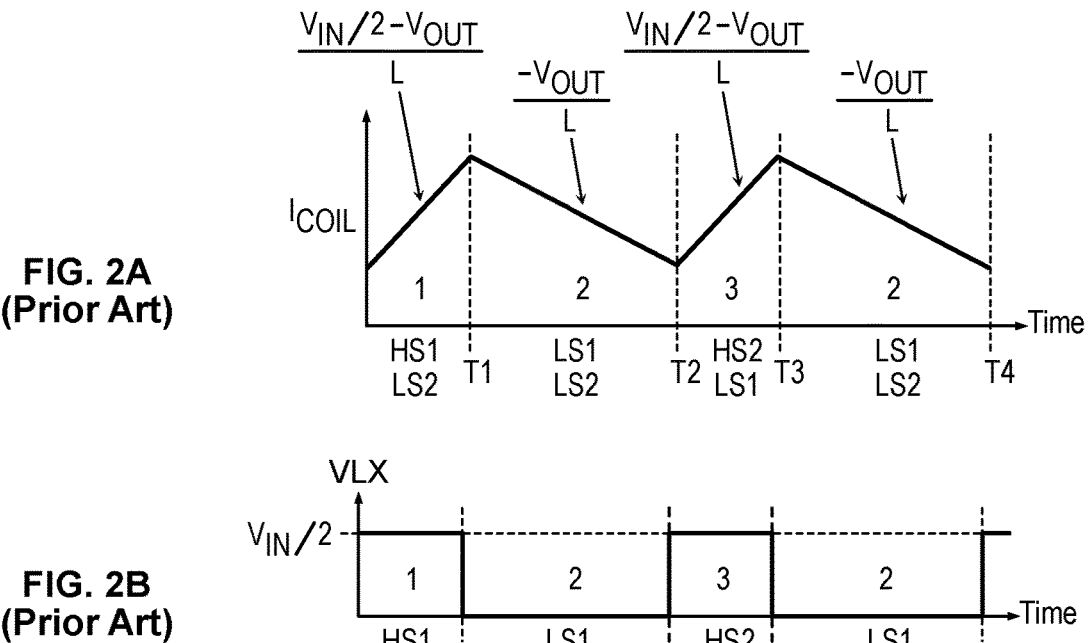
FIG. 2A
(Prior Art)
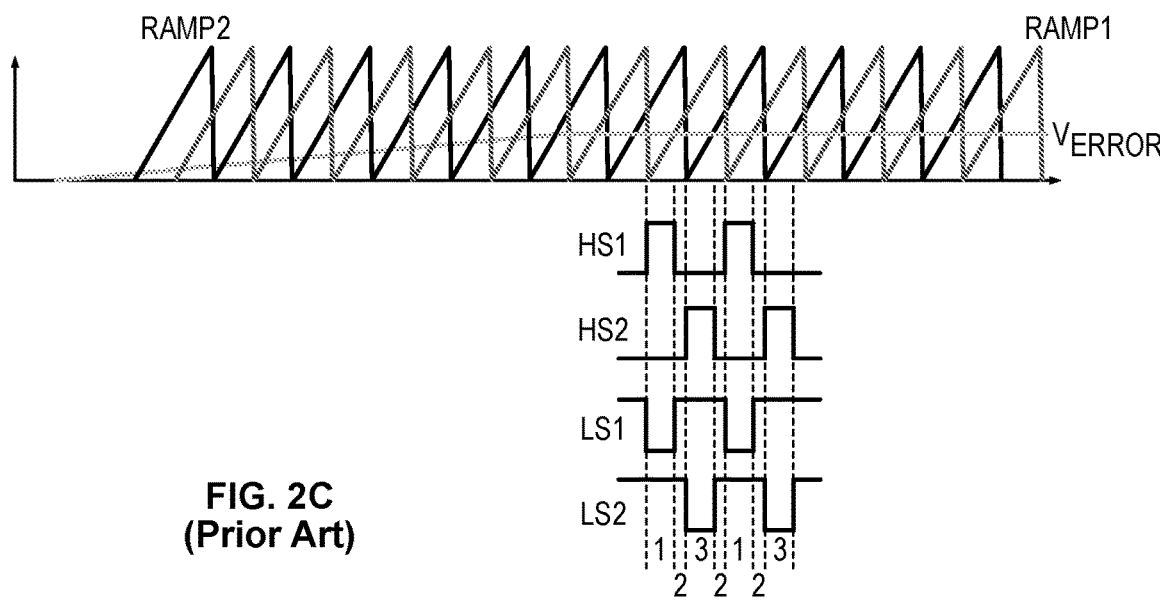
FIG. 2B
(Prior Art)
FIG. 2C
(Prior Art)

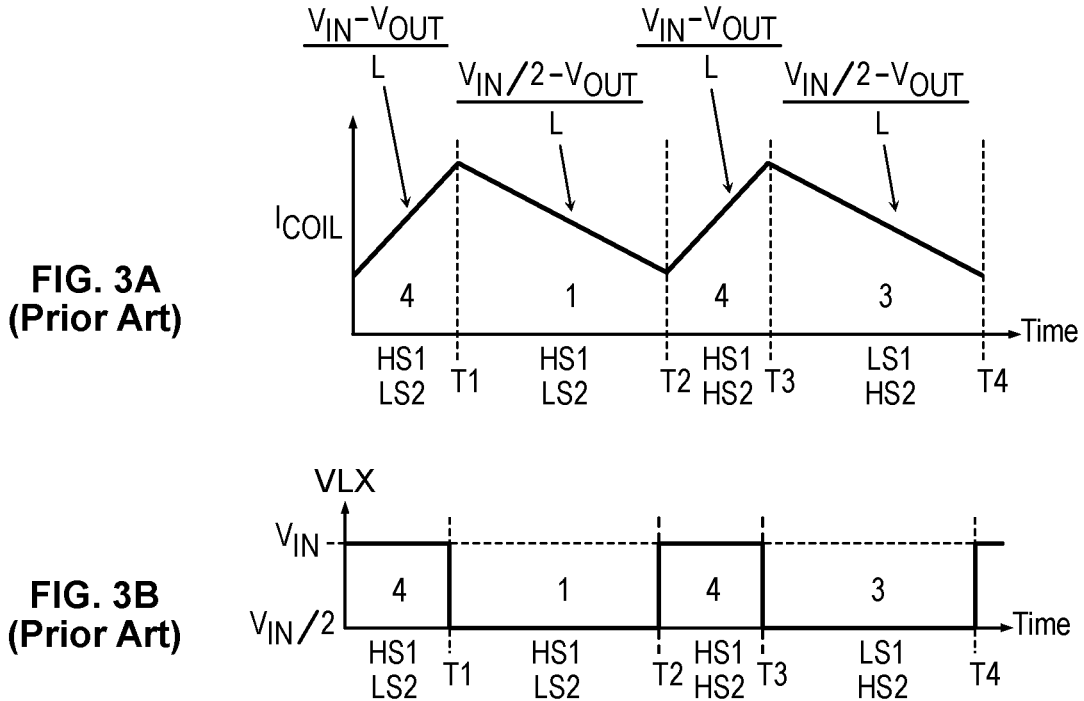
FIG. 3A
(Prior Art)
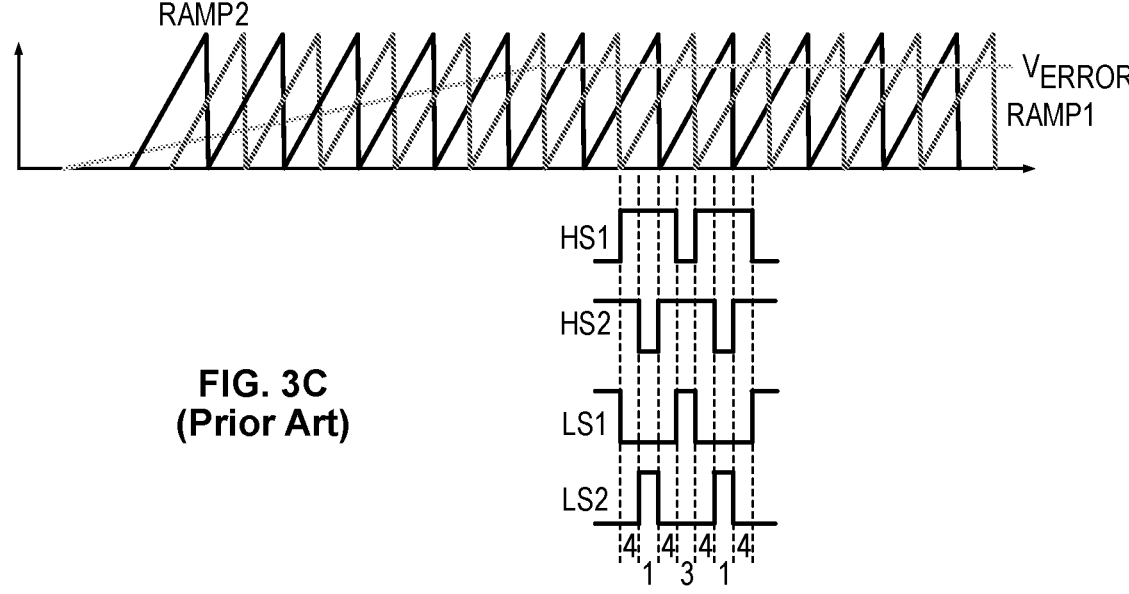
FIG. 3B
(Prior Art)
FIG. 3C
(Prior Art)

RAMP2

RAMP1

V_ERROR

HS1

HS2

LS2

LS1

1    3    4    1    3    4

RAMP1

RAMP2

V_ERROR

HS1

HS2

LS2

LS1

1    4    3    1    4    3

BALANCE SYSTEM TO REGULATE THE VOLTAGE OF THE FLY CAPACITOR OF A THREE-LEVEL BUCK ACTING ON RAMPS

TECHNICAL FIELD

This disclosure is directed to the field of power electronics and, in particular, to control systems for three-level buck converters.

BACKGROUND

DC-DC converters are frequently utilized in modern electronic devices, providing the necessary voltage transformation for a variety of applications. Buck converters, in particular, are utilized for their efficiency in stepping down voltage.

Two-level buck converters are widely utilized in low to medium power applications. However, as power requirements increase, issues such as electromagnetic interference, switching losses, and the need for larger inductors and capacitors become more significant. To address these concerns, three-level buck converters have been developed and utilize additional switches and capacitors to create intermediate voltage levels. This design reduces the voltage stress on each switch, allowing for the use of lower-rated and more efficient components.

A known three-level buck converter 10 is now described with reference to FIG. 1. The three-level buck converter 10 includes: a first n-channel transistor MN1 having its drain connected to an input voltage $V_{IN}$ and its source connected to a first tap TAP1, a second n-channel transistor MN2 having its drain connected to the first tap TAP1 and its source connected to a second tap TAP2, a third n-channel transistor MN3 having its drain connected to the second tap TAP2 and its source connected to a third tap TAP3, and a fourth n-channel transistor MN4 having its drain connected to the third tap TAP3 and its source coupled to ground. The gates of n-channel transistors MN1, MN2, MN3, MN4 are driven by respective control voltages HS1, HS2, LS2, LS1 generated by a logic/driver circuit 15—assertion of control voltage HS1 turns on transistor MN1 while deassertion of HS1 control voltage turns off transistor MN1, assertion of control voltage HS2 turns on transistor MN2 while deassertion of control voltage HS2 turns off transistor MN2, assertion of control voltage LS2 turns on transistor MN3 while deassertion of control voltage LS2 turns off transistor MN3, and assertion of control voltage LS1 turns on transistor MN4 while deassertion of control voltage LS1 turns off transistor MN4.

A flying capacitor $C_{FLY}$ is connected between first tap TAP1 and third tap TAP3. An inductor L is connected between the second tap TAP2 and an output capacitor $C_{OUT}$ at which an output voltage $V_{OUT}$ is produced. A feedback divider is formed by feedback resistors $R_{FB1}$, $R_{FB2}$ connected in series between the output capacitor $C_{OUT}$ and ground, with a feedback voltage $V_{FB}$ being formed at the tap between resistors $R_{FB1}$, $R_{FB2}$.

A proportional-integral-derivative (PID) controller 14 receives the feedback voltage $V_{FB}$ and a reference voltage $V_{REF}$ as input and generates an error voltage $V_{ERROR}$ based upon the difference between the feedback voltage $V_{FB}$ and the reference voltage $V_{REF}$. A first comparator 11 receives the error voltage $V_{ERROR}$ at its non-inverting input, compares it to a first ramp signal RAMP1 received at its inverting input from a ramp generator 13, and provides output OUT1 to the logic/driver circuit 15. A second comparator 12 receives the error voltage $V_{ERROR}$ at its non-inverting input, compares it to a second ramp signal RAMP2 received at its inverting input from the ramp generator 13, and provides output OUT2 to the logic/driver circuit 15. The ramp signals RAMP1 and RAMP2 are 180° out of phase.

Operation with a duty cycle of less than 50%, where $V_{OUT} < V_{IN}/2$, includes three phases. In the first phase, control voltages HS1 and LS2 are asserted, resulting in current flow from $V_{IN}$, through transistor MN1, through capacitor $C_{FLY}$, and out to inductor L through transistor MN3. As shown in the graphs of FIGS. 2A-2B, during this first phase, assuming $V_{CFLY}=V_{IN}/2$, the voltage VLX formed at the second tap TAP2 is equal to one half the input voltage, namely $VLX=V_{IN}/2$, and the inductor current increases with a rate of change of $$\frac{V_{IN/2} - V_{OUT}}{L}.$$

In the second phase, control voltages LS1 and LS2 are asserted to turn on transistors MN3 and MN4, resulting in in discharge of the inductor L. As shown in the graphs of FIGS. 2A-2B, during this second phase, the voltage VLX is equal to 0 and the inductor current decreases with a rate of change of $-V_{OUT}/L$. In the third phase, control voltages HS2 and LS1 are asserted to turn on transistors MN2 and MN4, resulting in discharge of the flying capacitor $C_{FLY}$ to inductor L. As shown in the graphs of FIGS. 2A-2B, during this third phase, the voltage VLX formed at second tap TAP2 is equal to one half the input voltage, namely $VLX=V_{IN}/2$, and the inductor current increases with a rate of change of $$\frac{V_{IN/2} - V_{OUT}}{L}.$$

As shown in FIG. 2C, the order of phase execution is Phase 1, Phase 2, Phase 3, Phase 2, Phase 1, Phase 2, Phase 3, Phase 2, etc.

Operation with a duty cycle of greater than 50%, where $V_{OUT} > V_{IN}/2$, includes the above described first and third phases, as well as a fourth phase. In the fourth phase, control voltages HS1 and HS2 are asserted, resulting in current flow from the input voltage $V_{IN}$, through transistor MN1, through transistor MN2 to inductor L.

As shown in the graphs of FIGS. 3A-3B, during this fourth phase, the voltage VLX formed at second tap TAP2 is equal to the input voltage, namely $VLX=V_{IN}$, and the inductor current increases with a rate of change of $$\frac{V_{IN} - V_{OUT}}{L}.$$

During the first phase, the voltage VLX formed at the second tap TAP2 is $V_{IN}/2$, and the inductor current decreases with a rate of change of $$\frac{V_{IN/2} - V_{OUT}}{L}.$$

During the third phase, the voltage VLX formed at the second tap TAP2 is $V_{IN}/2$ and the inductor current decreases with a rate of change of $$\frac{V_{IN/2} - V_{OUT}}{L}.$$

As shown in FIG. 3C, the order of phase execution is Phase 4, Phase 1, Phase 4, Phase 3, Phase 4, Phase 1, Phase 4, Phase 3, etc.

An advantage of three-levels buck converters such as that of FIG. 1 is their capacity to employ power MOSFETs MN1, MN2, MN3, MN4 with an Absolute Maximum Rating (AMR) equivalent to $V_{IN}/2$ assuming that the flying capacitor $C_{FLY}$ is maintained at a consistent voltage $V_{CFLY}$ level of $V_{IN}/2$, This not only enhances the efficiency of the three-level converter but also allows for the utilization of lower-rated, and hence potentially more economical, power MOS-FETs. Practical implementations incorporate a safety margin to account for dynamic variations and provide for the reliability of the three-level buck converter under fluctuating operating conditions. A deviation from the ideal condition, where the voltage across the flying capacitor $C_{FLY}$ does not equal $V_{IN}/2$, can lead to suboptimal current waveforms through the inductor L, which may compromise the performance of the three-level buck converter.

Therefore, development of techniques to maintain the voltage across the flying capacitor $C_{FLY}$ at $V_{IN}/2$ is needed.

SUMMARY

Disclosed herein is a DC-DC converter including a power stage, the power stage including: a first high-side transistor coupled between an input voltage and a high-side tap, a second high-side transistor coupled between the high-side tap and an output tap, a first low-side transistor coupled between a low-side tap and ground, and a second low-side transistor coupled between the output tap and the low-side tap; a flying capacitor coupled between the high-side tap and the low-side tap; an inductor coupled between the output tap and an output node; an output capacitor coupled between the output node and ground; and a feedback divider coupled in parallel with the output capacitor, with a feedback voltage being formed at a tap of the feedback divider. The DC-DC converter further includes a ramp generator configured to generate a first ramp signal and a second ramp signal, wherein the ramp generator generates the first ramp signal as a function of a constant reference voltage and generates the second ramp signal as a function of a difference between a voltage across the flying capacitor and one half the input voltage.

Control circuitry in the DC-DC converter is configured to: generate an error signal based on a comparison between the feedback voltage and a reference voltage; generate a first high-side control signal for the first high-side transistor, and a first low-side control signal for the first low-side transistor, based on a comparison between the first ramp signal and the error signal; and generate a second high-side control signal for the second high-side transistor, and a second low-side control signal for the second low-side transistor, based on a comparison between the second ramp signal and the error signal.

The ramp generator may be formed by first ramp generation circuitry which includes: a first voltage-to-current converter configured to generate a first charging current based upon the constant reference voltage; a first timing capacitor configured to receive the first charging current; and a first reset transistor configured to discharge the first timing capacitor at a first edge of a clock signal; wherein the first ramp signal is generated as a function of the charging and discharging of the first timing capacitor.

The first voltage-to-current converter may include: a first amplifier having a non-inverting input receiving the constant reference voltage, an inverting input coupled to ground through a first sense resistor, and an output; a first n-channel transistor having a source coupled to ground through the first sense resistor, a gate coupled to the output of the first amplifier, and a drain; a first p-channel transistor having a source coupled to a supply voltage, a drain coupled to the drain of the first n-channel transistor, and a gate coupled to the drain of the first p-channel transistor; a second p-channel transistor having a source coupled to the supply voltage, a drain coupled to the first timing capacitor, and a gate coupled to the gate of the first p-channel transistor; and a second n-channel transistor having a drain coupled to the first timing capacitor, a source coupled to ground, and a gate coupled to a first reset signal, assertion of the first reset signal corresponding to the first edge of the clock signal.

The ramp generator may also have second ramp generation circuitry which includes: a second voltage-to-current converter configured to generate a second charging current based upon the difference between the voltage across the flying capacitor and one half the input voltage; a second timing capacitor configured to receive the second charging current; and a second reset transistor configured to discharge the second timing capacitor at a second edge of the clock signal; wherein the second ramp signal is generated as a function of the charging and discharging of the second timing capacitor.

The second voltage-to-current converter may include: a second amplifier having a non-inverting input receiving a delta voltage whose slope is proportional to the difference between one half the input voltage and the voltage across the flying capacitor, an inverting input coupled to ground through a second sense resistor, and an output; a third n-channel transistor having a source coupled to ground through the second sense resistor, a gate coupled to the output of the second amplifier, and a drain; a third p-channel transistor having a source coupled to a supply voltage, a drain coupled to the drain of the third n-channel transistor, and a gate coupled to the drain of the third p-channel transistor; a fourth p-channel transistor having a source coupled to the supply voltage, a drain coupled to the second timing capacitor, and a gate coupled to the gate of the third p-channel transistor; and a fourth n-channel transistor having a drain coupled to the second timing capacitor, a source coupled to ground, and a gate coupled to a second reset signal, assertion of the second reset signal corresponding to the second edge of the clock signal.

The DC-DC converter may include balancing circuitry, the balancing circuitry having an amplifier having a first input coupled to receive one half the input voltage, a second input coupled to the voltage across the flying capacitor through a balance resistor, and an output coupled to the second input through a balance capacitor, wherein a delta voltage is generated at the output of the amplifier, the delta voltage having a slope that is proportional to the difference between one half the input voltage and the voltage across the flying capacitor. The second voltage-to-current converter generates the second charging current based upon the delta voltage.

The DC-DC converter may include balancing circuitry, the balancing circuitry having an amplifier having a non-inverting input coupled to receive one half the input voltage, an inverting input coupled to the voltage across the flying capacitor through a balance resistor, and an output coupled to the inverting input through a balance capacitor, wherein a delta voltage is generated at the output of the amplifier, the delta voltage having a slope that is proportional to the difference between one half the input voltage and the voltage across the flying capacitor. The second voltage-to-current converter generates the second charging current based upon the delta voltage.

Method aspects are disclosed. For example, disclosed herein is a method of operating a DC-DC converter, including: converting an input voltage to an output voltage using a power stage; generating a first ramp signal as a function of a constant reference voltage; generating a second ramp signal as a function of a difference between one half the input voltage and a voltage across a flying capacitor of the power stage; generating an error signal based on a comparison between a reference voltage and a feedback voltage representative of the output voltage; generating a first high-side control signal for a first high-side transistor of the power stage, and a first low-side control signal for a first low-side transistor of the power stage, based on a comparison between the first ramp signal and the error signal; and generating a second high-side control signal for a second high-side transistor of the power stage, and a second low-side control signal for a second low-side transistor of the power stage, based on a comparison between the second ramp signal and the error signal.

Generating the first ramp signal may include: generating a first charging current based upon the constant reference voltage; receiving the first charging current at a first timing capacitor; and discharging the first timing capacitor at a first edge of a clock signal; wherein the first ramp signal is generated as a function of the charging and discharging of the first timing capacitor.

Generating the second ramp signal may include: generating a second charging current based on a delta voltage whose slope is proportional to a difference between one half the input voltage and the voltage across the flying capacitor; receiving the second charging current at a second timing capacitor; and discharging the second timing capacitor at a second edge of the clock signal; wherein the second ramp signal is generated as a function of the charging and discharging of the second timing capacitor.

Also disclosed herein is a DC-DC converter, including: a power stage configured to convert an input voltage to an output voltage using a power stage; and a ramp generator. The ramp generator is configured to: generate a first ramp signal as a function of a constant reference voltage; and generate a second ramp signal as a function of a difference between one half the input voltage and a voltage across a flying capacitor of the power stage. An error amplifier is configured to generate an error signal based on a comparison between a reference voltage and a feedback voltage representative of the output voltage. Control circuitry is configured to: generate a first high-side control signal for a first high-side transistor of the power stage, and a first low-side control signal for a first low-side transistor of the power stage, based on a comparison between the first ramp signal and the error signal; and generate a second high-side control signal for a second high-side transistor of the power stage, and a second low-side control signal for a second low-side transistor of the power stage, based on a comparison between the second ramp signal and the error signal.

The ramp generator may generate the first ramp signal by: generating a first charging current based upon the constant reference voltage; receiving the first charging current at a first timing capacitor; and discharging the first timing capacitor at a first edge of a clock signal; wherein the first ramp signal is generated as a function of the charging and discharging of the first timing capacitor.

The ramp generator may generate the second ramp signal by: generating a second charging current based on a delta voltage whose slope is proportional to a difference between one half the input voltage and the voltage across the flying capacitor; receiving the second charging current at a second timing capacitor; and discharging the second timing capacitor at a second edge of the clock signal; wherein the second ramp signal is generated as a function of the charging and discharging of the second timing capacitor.

BRIEF DESCRIPTION OF THE DRAWINGS

FIG. 2A is a graph of the inductor current of the three-level buck converter of FIG. 1 in operation when the duty cycle is less than 50%.

FIG. 2B is a graph of the voltage at the second tap node of the three-level buck converter of FIG. 1 in operation when the duty cycle is less than 50%.

FIG. 2C is a graph showing the ramp voltages, error signal, and gate control voltages of the three-level buck converter of FIG. 1 in operation when the duty cycle is less than 50%.

FIG. 3A is a graph of the inductor current of the three-level buck converter of FIG. 1 in operation when the duty cycle is greater than 50%.

FIG. 3B is a graph of the voltage at the second tap node of the three-level buck converter of FIG. 1 in operation when the duty cycle is greater than 50%.

FIG. 3C is a graph showing the ramp voltages, error signal, and gate control voltages of the three-level buck converter of FIG. 1 in operation when the duty cycle is greater than 50%.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following descriptions given either hereinabove or hereinbelow, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 1:
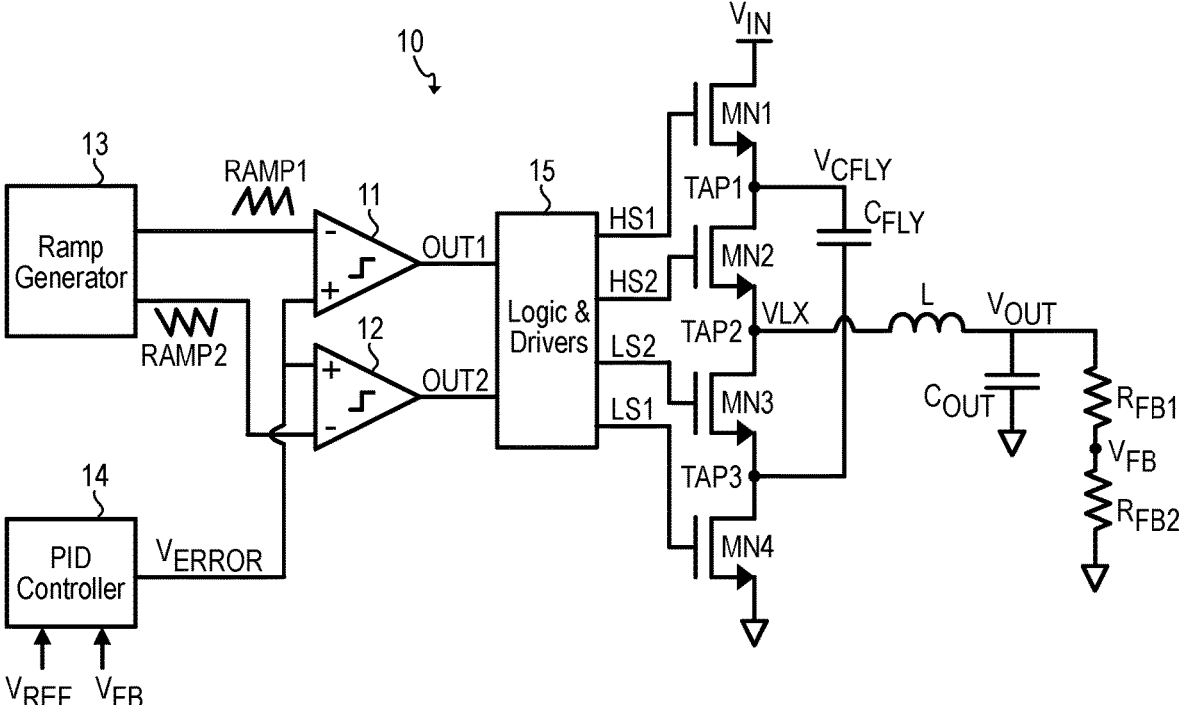
FIG. 1 is a schematic block diagram of a known three-level buck converter.
Figure 4:
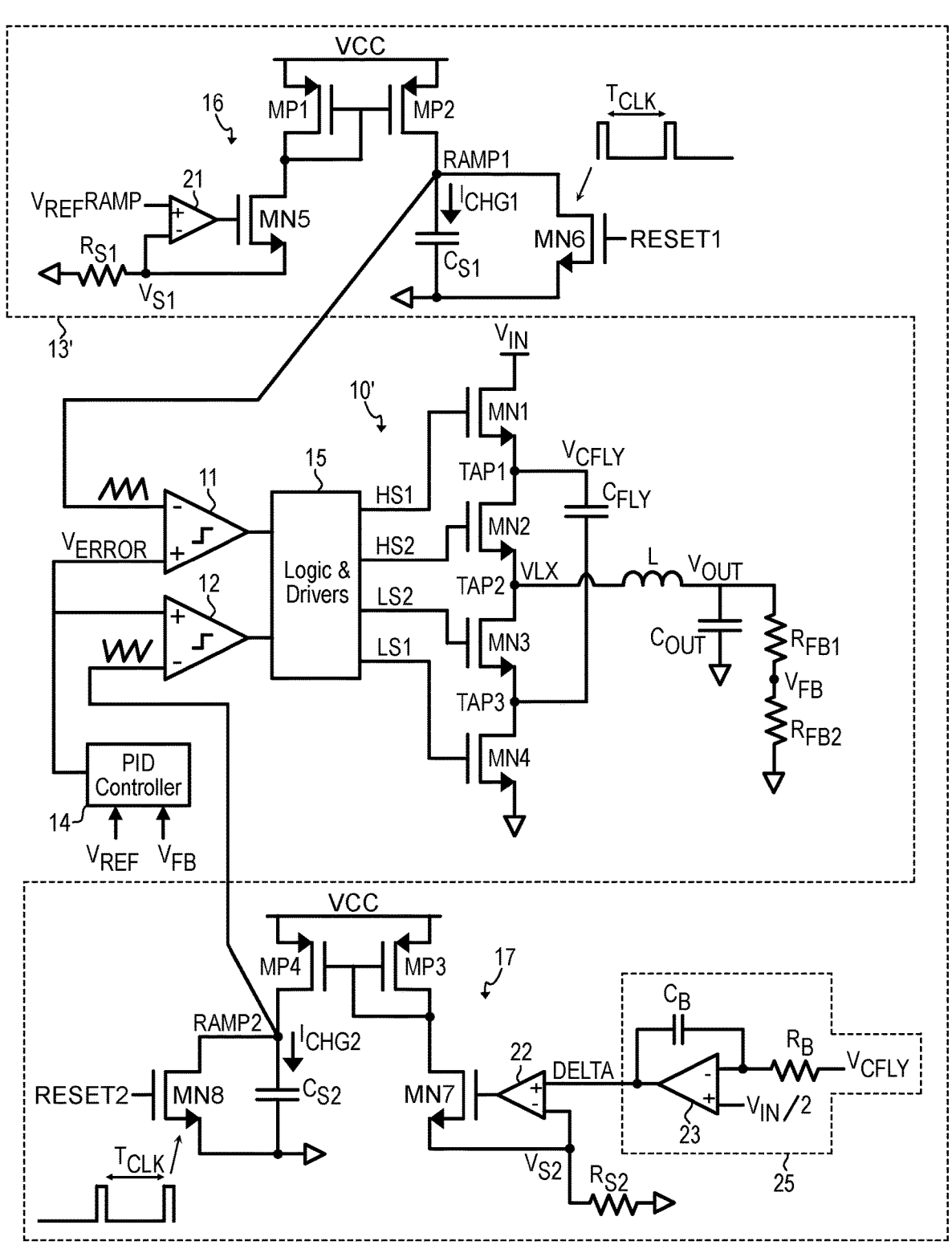
FIG. 4 is a schematic block diagram of a ramp generator usable with the three-level buck converter of FIG. 1 to operate the three-level buck converter such that the voltage across the flying capacitor $C_{FLY}$ is maintained at $V_{IN}/2$.

Described herein with initial reference to FIG. 4 is a ramp generator 13' usable with a three-level buck converter 10' that causes that three-level buck converter, or any suitable three-level buck converter, to maintain the voltage $V_{CFLY}$ across the flying capacitor $C_{FLY}$ at the desired value of $V_{IN}/2$ The difference between the three-level buck converter 10' of FIG. 4 and the three-level buck converter 10 of FIG. 1 is that the three-level buck converter 10' of FIG. 4 includes ramp generator 13' as opposed to ramp generator 13.

The ramp generator 13' includes a first ramp generator circuit 16 for generating the first ramp signal RAMP1 and a second ramp generator circuit 17 for generating the second ramp signal RAMP2.

The first ramp generator circuit 16 includes an amplifier 21 having its non-inverting input coupled to receive a fixed ramp reference voltage $V_{REF}$ RAMP, its inverting input coupled to ground through a sense resistor $R_{S1}$, and its output connected to the gate of n-channel transistor MN5. N-channel transistor MN5 has its source connected to the inverting input of the amplifier 21 and its drain connected to the drain and gate of p-channel transistor MP1. P-channel transistor MP1 has its source coupled to a supply voltage VCC and its drain connected to its gate and to the drain of n-channel transistor MN5. P-channel transistor MP2 has its source coupled to the supply voltage VCC, its drain coupled to ground through timing capacitor $C_{S1}$, and its gate connected to the gate of p-channel transistor MP1. N-channel transistor MN6 has its drain connected to the drain of p-channel transistor MP2, its source coupled to ground, and its gate coupled to a first reset signal RESET1.

The second ramp generator circuit 17 includes an amplifier 22 having its non-inverting input coupled to receive a voltage DELTA whose slope is proportional to the difference between the desired voltage $V_{IN}/2$ and the voltage $V_{CFLY}$ across the flying capacitor $C_{FLY}$. The amplifier 22 has its inverting input coupled to ground through a sense resistor $R_{S2}$, and its output connected to the gate of n-channel transistor MN7. N-channel transistor MN7 has its source connected to the inverting input of the amplifier 22 and its drain connected to the drain and gate of p-channel transistor MP3. P-channel transistor MP3 has its source coupled to the supply voltage VCC and its drain connected to its gate and to the drain of n-channel transistor MN7. P-channel transistor MP4 has its source coupled to the supply voltage VCC, its drain coupled to ground through timing capacitor $C_{S2}$, and its gate connected to the gate of p-channel transistor MP3. N-channel transistor MN8 has its drain connected to the drain of p-channel transistor MP4, its source coupled to ground, and its gate coupled to a second reset signal RESET2.

The voltage DELTA is generated by balancing circuit 25. Balancing circuit 25 includes an amplifier 23 having its inverting input coupled to receive the voltage $V_{CFLY}$ through resistor $R_B$, its non-inverting input coupled to receive the desired voltage $V_{IN}/2$, and its output connected to the inverting input of amplifier 22 to provide DELTA thereto. A feedback capacitor $C_B$ is connected between the inverting input and the output of the amplifier 23.

The generation of the control voltages HS1, HS2, LS1, LS2 by the logic/driver circuitry 15 of FIG. 4 is now described. Comparator 11 receives the error voltage $V_{ERROR}$ at its non-inverting input, receives the first ramp signal RAMP1 at its inverting input, and provides output to the logic/driver circuitry 15 which generates the control voltage HS1 based upon the comparison between $V_{ERROR}$ and RAMP1, and generates control voltage LS1 as the inverse of control voltage HS1. Comparator 12 receives the error voltage $V_{ERROR}$ at its non-inverting input, receives the second ramp signal RAMP2 at its inverting input, and provides output to the logic/driver circuitry 15 which generates the control voltage HS2 based upon the comparison between $V_{ERROR}$ and RAMP2, and generates control voltage LS2 as the inverse of control voltage HS2.

In operation, the arrangement of the amplifier 21 and n-channel transistor MN5 acts as a voltage to current converter, with n-channel transistor MN5 sinking a current equal to $V_{REF}$RAMP/$R_{S1}$. The current sunk by n-channel transistor MN5 is mirrored by the current mirror arrangement of p-channel transistors MP1 and MP2 to produce a charging current $I_{CHG}$. Beginning with deassertion of the reset signal RESET1 (which may occur at a rising or falling edge of a clock signal), the charging current $I_{CHG1}$ charges timing capacitor $C_{S1}$. Due to the aforementioned voltage to current converter arrangement, the charging current $I_{CHG1}$ is equal to $V_{REF}$RAMP/$R_{S1}$, and charges the timing capacitor $C_{S1}$ until the reset signal RESET is asserted at the next edge of the clock signal.

The peak voltage of the first ramp signal RAMP1 achieved during a cycle can be calculated as $$V_{PEAK1} = \frac{T_{CLK}}{R_{S1} \cdot C_{S1}} \cdot V_{REF}\text{RAMP},$$

where $T_{CLK}$ is the switching period of the clock signal (and thus the reset signal RESET1).

The arrangement of the amplifier 22 and n-channel transistor MN7 acts as a voltage to current converter, with n-channel transistor MN7 sinking a current equal to DELTA/$R_{S2}$. The current sunk by n-channel transistor MN7 is mirrored by the current mirror arrangement of p-channel transistors MP3 and MP4 to produce a charging current $I_{CHG2}$. Beginning with deassertion of the reset signal RESET2 (which may occur at a falling or rising edge of a clock signal, with RESET2 being the opposite of RESET1), the charging current $I_{CHG2}$ charges timing capacitor $C_{S2}$. The charging current $I_{CHG2}$ is equal to DELTA/$R_{S2}$, and charges the timing capacitor $C_{S2}$ until the reset signal RESET2 is asserted at the next edge of the clock signal.

The peak voltage of the second ramp signal RAMP2 achieved during a cycle can be calculated as $$V_{PEAK2} = \frac{T_{CLK}}{R_{S2} \cdot C_{S2}} \cdot \text{DELTA} -,$$

where $T_{CLK}$ is the switching period of the clock signal (and thus the reset signal RESET2).

Appreciate from the above that the first ramp signal RAMP1 has a fixed amplitude because it is generated based upon the ramp reference voltage $V_{REF}$RAMP, which is a fixed signal, while the second ramp signal RAMP2 has a variable amplitude that is proportional to DELTA. This generation of the second ramp signal RAMP2 to be proportional to DELTA, which itself has a slope proportional to the difference between the desired voltage $V_{IN}/2$ and the voltage $V_{CFLY}$ across the flying capacitor $C_{FLY}$ provides for correction of mismatch between the first ramp signal RAMP1 and second ramp signal RAMP2 due to process, device variation, etc.

For example, if the voltage $V_{CFLY}$ across the flying capacitor $C_{FLY}$ is lower than $V_{IN}/2$, DELTA will increase, and as a result the amplitude of ramp signal RAMP2 will be higher than that of RAMP1, having the effect of the pulse width of control voltages HS1, LS1 being wider than the pulse width of control voltages HS2, LS2. Thus, the charging phase of the first ramp generator circuit 16 will be longer than the discharging phase of the second ramp generator circuit 17, causing the voltage $V_{CFLY}$ across the flying capacitor $C_{FLY}$ to increase until it is equal to $V_{IN}/2$.

Figures 5A, 5B:
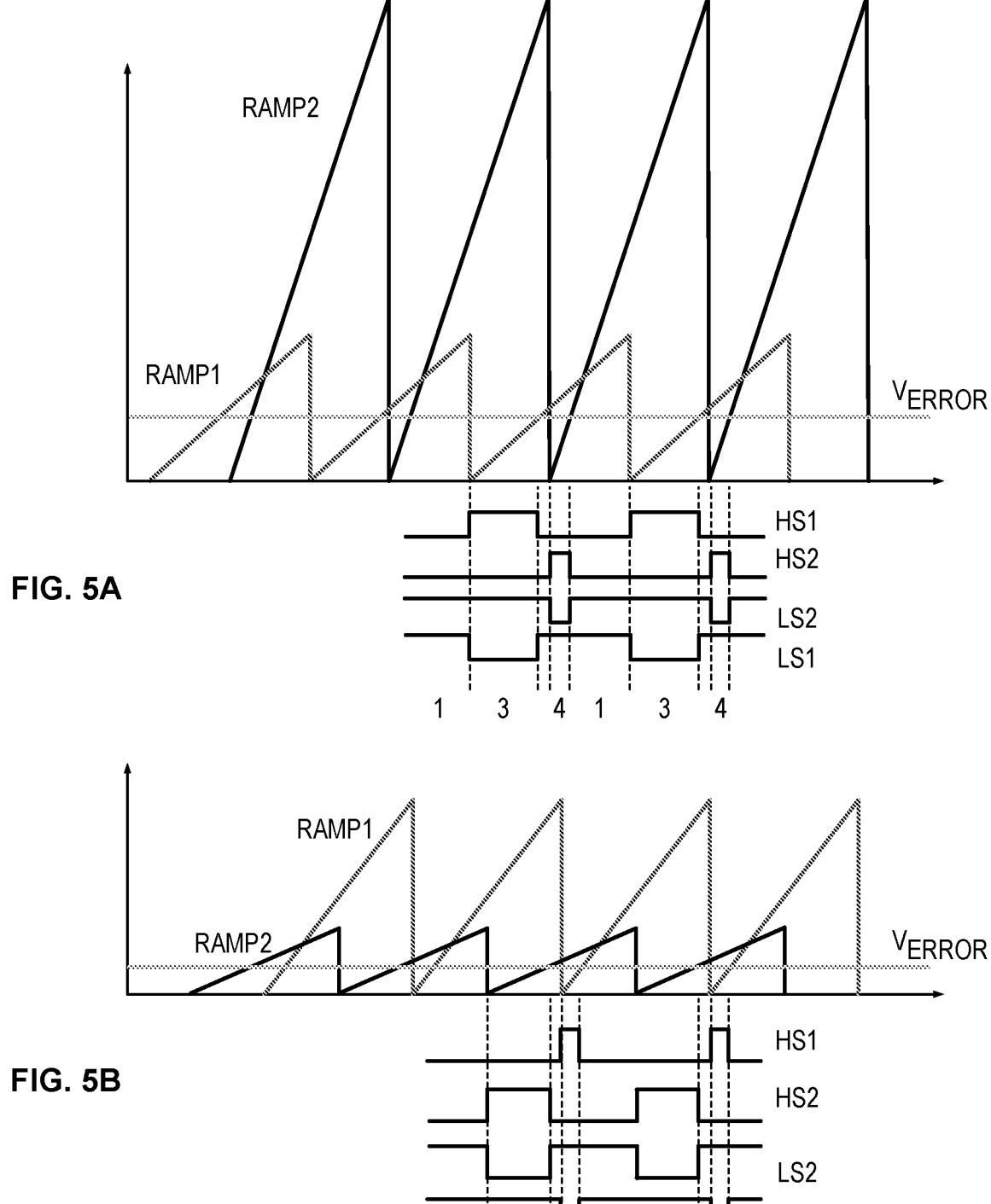
FIG. 5A is a graph of the ramp voltages and control signals of the three-level buck converter of FIG. 1 when utilizing the ramp generator of FIG. 4 in a condition where the voltage $V_{CFLY}$ across the flying capacitor $C_{FLY}$ is lower than $V_{IN}/2$.
FIG. 5B is a graph of the ramp voltages and control signals of the three-level buck converter of FIG. 1 when utilizing the ramp generator of FIG. 4 in a condition where the voltage $V_{CFLY}$ across the flying capacitor $C_{FLY}$ is higher than $V_{IN}/2$.

Operation in this condition (in which the voltage $V_{CFLY}$ across the flying capacitor $C_{FLY}$ is lower than $V_{IN}/2$) is shown in the graphs of FIG. 5A, where the above-described effects on control voltages HS2, LS2 and ramp signal RAMP2 can be observed.

Conversely, if the voltage $V_{CFLY}$ across the flying capacitor $C_{FLY}$ is higher than $V_{IN}/2$, DELTA will decrease, and a result of this, the amplitude of ramp signal RAMP2 will be lower than that of ramp signal RAMP1, having the effect of the pulse width of control voltages HS2, LS2 being wider than the pulse width of control voltages HS1, LS1. Thus, the discharging phase of the second ramp generator circuit 17 will be longer than the charging phase of the first ramp generator circuit 16, causing the voltage $V_{CFLY}$ across the flying capacitor $C_{FLY}$ to decrease until it is equal to $V_{IN}/2$.

Operation in this condition (in which the voltage $V_{CFLY}$ across the flying capacitor $C_{FLY}$ is higher than $V_{IN}/2$) is shown in the graphs of FIG. 5B, where the above-described effects on control voltages HS2, LS2 and ramp signal RAMP2 can be observed.

When steady state is achieved, voltage DELTA will be substantially equal to the ramp reference voltage $V_{REF}$RAMP except for mismatches between the two ramp generators 16 and 17.

The use of the ramp generator 13' provides for maintenance of the voltage across the flying capacitor $C_{FLY}$ at $V_{IN}/2$, which as explained above is desirable for efficiency reasons and for proper performance of the three-level buck converter.

It is evident that modifications and variations can be made to what has been described and illustrated herein without departing from the scope of this disclosure. For example, the ramp generator 13' described herein is usable with other types of three-level DC-DC converters, for example three-level boost converters.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A DC-DC converter, comprising:
a power stage comprising:
    a first high-side transistor coupled between an input voltage and a high-side tap, a second high-side transistor coupled between the high-side tap and an output tap, a first low-side transistor coupled between a low-side tap and ground, and a second low-side transistor coupled between the output tap and the low-side tap;
    a flying capacitor coupled between the high-side tap and the low-side tap;
    an inductor coupled between the output tap and an output node;
    an output capacitor coupled between the output node and ground; and
    a feedback divider coupled in parallel with the output capacitor, with a feedback voltage being formed at a tap of the feedback divider;
a ramp generator configured to generate a first ramp signal and a second ramp signal, wherein the ramp generator generates the first ramp signal as a function of a constant reference voltage and generates the second ramp signal as a function of a difference between a voltage across the flying capacitor and one half the input voltage;
control circuitry configured to:
    generate an error signal based on a comparison between the feedback voltage and a reference voltage;
    generate a first high-side control signal for the first high-side transistor, and a first low-side control signal for the first low-side transistor, based on a comparison between the first ramp signal and the error signal; and
    generate a second high-side control signal for the second high-side transistor, and a second low-side control signal for the second low-side transistor, based on a comparison between the second ramp signal and the error signal.

2. The DC-DC converter of claim 1, wherein the ramp generator comprises:
first ramp generation circuitry comprising:
    a first voltage-to-current converter configured to generate a first charging current based upon the constant reference voltage;
    a first timing capacitor configured to be charged by the first charging current; and
    a first reset transistor configured to discharge the first timing capacitor at a first edge of a clock signal;
    wherein the first ramp signal is generated as a function of the charging and discharging of the first timing capacitor.

3. The DC-DC converter of claim 2, wherein the first voltage-to-current converter comprises:
a first amplifier having a non-inverting input receiving the constant reference voltage, an inverting input coupled to ground through a first sense resistor, and an output;
a first n-channel transistor having a source coupled to ground through the first sense resistor, a gate coupled to the output of the first amplifier, and a drain;
a first p-channel transistor having a source coupled to a supply voltage, a drain coupled to the drain of the first n-channel transistor, and a gate coupled to the drain of the first p-channel transistor;
a second p-channel transistor having a source coupled to the supply voltage, a drain coupled to the first timing capacitor, and a gate coupled to the gate of the first p-channel transistor; and
a second n-channel transistor having a drain coupled to the first timing capacitor, a source coupled to ground, and a gate coupled to a first reset signal, assertion of the first reset signal corresponding to the first edge of the clock signal.

4. The DC-DC converter of claim 2, wherein the ramp generator further comprises:

second ramp generation circuitry comprising:

a second voltage-to-current converter configured to generate a second charging current based upon the difference between the voltage across the flying capacitor and one half the input voltage;

a second timing capacitor configured to be charged by the second charging current; and a second reset transistor configured to discharge the second timing capacitor at a second edge of the clock signal;

wherein the second ramp signal is generated as a function of the charging and discharging of the second timing capacitor.

5. The DC-DC converter of claim 4, wherein the second voltage-to-current converter comprises:

a second amplifier having a non-inverting input receiving a delta voltage whose slope is proportional to the difference between one half the input voltage and the voltage across the flying capacitor, an inverting input coupled to ground through a second sense resistor, and an output;

a third n-channel transistor having a source coupled to ground through the second sense resistor, a gate coupled to the output of the second amplifier, and a drain;

a third p-channel transistor having a source coupled to a supply voltage, a drain coupled to the drain of the third n-channel transistor, and a gate coupled to the drain of the third p-channel transistor;

a fourth p-channel transistor having a source coupled to the supply voltage, a drain coupled to the second timing capacitor, and a gate coupled to the gate of the third p-channel transistor; and a fourth n-channel transistor having a drain coupled to the second timing capacitor, a source coupled to ground, and a gate coupled to a second reset signal, assertion of the second reset signal corresponding to the second edge of the clock signal.

6. The DC-DC converter of claim 4, further comprising balancing circuitry, the balancing circuitry comprising an amplifier having a first input coupled to receive one half the input voltage, a second input coupled to the voltage across the flying capacitor through a balance resistor, and an output coupled to the second input through a balance capacitor, wherein a delta voltage is generated at the output of the amplifier, the delta voltage having a slope that is proportional to the difference between one half the input voltage and the voltage across the flying capacitor; and wherein the second voltage-to-current converter generates the second charging current based upon the delta voltage.

7. The DC-DC converter of claim 4, further comprising balancing circuitry, the balancing circuitry comprising an amplifier having a non-inverting input coupled to receive one half the input voltage, an inverting input coupled to the voltage across the flying capacitor through a balance resistor, and an output coupled to the inverting input through a balance capacitor, wherein a delta voltage is generated at the output of the amplifier, the delta voltage having a slope that is proportional to the difference between one half the input voltage and the voltage across the flying capacitor; and wherein the second voltage-to-current converter generates the second charging current based upon the delta voltage.

8. A method of operating a DC-DC converter, the method comprising:

converting an input voltage to an output voltage using a power stage;

generating a first ramp signal as a function of a constant reference voltage;

generating a second ramp signal as a function of a difference between one half the input voltage and a voltage across a flying capacitor of the power stage;

generating an error signal based on a comparison between a reference voltage and a feedback voltage representative of the output voltage;

generating a first high-side control signal for a first high-side transistor of the power stage, and a first low-side control signal for a first low-side transistor of the power stage, based on a comparison between the first ramp signal and the error signal; and generating a second high-side control signal for a second high-side transistor of the power stage, and a second low-side control signal for a second low-side transistor of the power stage, based on a comparison between the second ramp signal and the error signal.

9. The method of claim 8, wherein generating the first ramp signal comprises:

generating a first charging current based upon the constant reference voltage;

receiving the first charging current to charge a first timing capacitor; and discharging the first timing capacitor at a first edge of a clock signal;

wherein the first ramp signal is generated as a function of the charging and discharging of the first timing capacitor.

10. The method of claim 9, wherein generating the second ramp signal comprises:

generating a second charging current based on a delta voltage whose slope is proportional to a difference between one half the input voltage and the voltage across the flying capacitor;

receiving the second charging current to charge a second timing capacitor;

discharging the second timing capacitor at a second edge of the clock signal;

wherein the second ramp signal is generated as a function of the charging and discharging of the second timing capacitor.

11. A DC-DC converter, including:

a power stage configured to convert an input voltage to an output voltage;

a ramp generator configured to:

generate a first ramp signal as a function of a constant reference voltage; and generate a second ramp signal as a function of a difference between one half the input voltage and a voltage across a flying capacitor of the power stage;

an error amplifier configured to generate an error signal based on a comparison between a reference voltage and a feedback voltage representative of the output voltage; and control circuitry configured to:

generate a first high-side control signal for a first high-side transistor of the power stage, and a first low-side control signal for a first low-side transistor of the power stage, based on a comparison between the first ramp signal and the error signal; and generate a second high-side control signal for a second high-side transistor of the power stage, and a second low-side control signal for a second low-side transistor of the power stage, based on a comparison between the second ramp signal and the error signal.

12. The DC-DC converter of claim 11, wherein the ramp generator generates the first ramp signal by:

generating a first charging current based upon the constant reference voltage;

receiving the first charging current to charge a first timing capacitor; and discharging the first timing capacitor at a first edge of a clock signal; and wherein the first ramp signal is generated as a function of the charging and discharging of the first timing capacitor.

13. The DC-DC converter of claim 12, wherein the ramp generator generates the second ramp signal by:

generating a second charging current based on a delta voltage whose slope is proportional to a difference between one half the input voltage and the voltage across the flying capacitor;

receiving the second charging current to charge a second timing capacitor; and discharging the second timing capacitor at a second edge of the clock signal;

wherein the second ramp signal is generated as a function of the charging and discharging of the second timing capacitor.

14. A DC-DC converter, comprising:

a power stage comprising:

a first high-side transistor coupled between an input voltage and a high-side tap, a second high-side transistor coupled between the high-side tap and an output tap, a first low-side transistor coupled between a low-side tap and ground, and a second low-side transistor coupled between the output tap and the low-side tap;

a flying capacitor coupled between the high-side tap and the low-side tap;

an inductor coupled between the output tap and an output node;

an output capacitor coupled between the output node and ground; and a feedback divider coupled in parallel with the output capacitor, with a feedback voltage being formed at a tap of the feedback divider;

a ramp generator comprising:

first ramp generation circuitry comprising:

a first voltage-to-current converter configured to generate a first charging current based upon a constant reference voltage;

a first timing capacitor configured to be charged by the first charging current; and a first reset transistor configured to discharge the first timing capacitor at a first edge of a clock signal;

wherein a first ramp signal is generated as a function of the charging and discharging of the first timing capacitor; and wherein the first voltage-to-current converter comprises:

a first amplifier having a non-inverting input receiving the constant reference voltage, an inverting input coupled to ground through a first sense resistor, and an output;

a first n-channel transistor having a source coupled to ground through the first sense resistor, a gate coupled to the output of the first amplifier, and a drain;

a first p-channel transistor having a source coupled to a supply voltage, a drain coupled to the drain of the first n-channel transistor, and a gate coupled to the drain of the first p-channel transistor;

a second p-channel transistor having a source coupled to the supply voltage, a drain coupled to the first timing capacitor, and a gate coupled to the gate of the first p-channel transistor; and a second n-channel transistor having a drain coupled to the first timing capacitor, a source coupled to ground, and a gate coupled to a first reset signal, assertion of the first reset signal corresponding to the first edge of the clock signal;

second ramp generation circuitry comprising:

a second voltage-to-current converter configured to generate a second charging current based upon a difference between a voltage across the flying capacitor and one half the input voltage;

a second timing capacitor configured to be charged by the second charging current; and a second reset transistor configured to discharge the second timing capacitor at a second edge of the clock signal;

wherein a second ramp signal is generated as a function of the charging and discharging of the second timing capacitor;

wherein the second voltage-to-current converter comprises:

a second amplifier having a non-inverting input receiving a delta voltage whose slope is proportional to the difference between one half the input voltage and the voltage across the flying capacitor, an inverting input coupled to ground through a second sense resistor, and an output;

a third n-channel transistor having a source coupled to ground through the second sense resistor, a gate coupled to the output of the second amplifier, and a drain;

a third p-channel transistor having a source coupled to the supply voltage, a drain coupled to the drain of the third n-channel transistor, and a gate coupled to the drain of the third p-channel transistor;

a fourth p-channel transistor having a source coupled to the supply voltage, a drain coupled to the second timing capacitor, and a gate coupled to the gate of the third p-channel transistor; and a fourth n-channel transistor having a drain coupled to the second timing capacitor, a source coupled to ground, and a gate coupled to a second reset signal, assertion of the second reset signal corresponding to the second edge of the clock signal;

control circuitry configured to:

generate an error signal based on the feedback voltage and a reference voltage;

generate a first high-side control signal for the first high-side transistor, and a first low-side control signal for the first low-side transistor, based on the first ramp signal and the error signal; and generate a second high-side control signal for the second high-side transistor, and a second low-side control signal for the second low-side transistor, based on the second ramp signal and the error signal.

15. The DC-DC converter of claim 14, further comprising balancing circuitry, the balancing circuitry comprising an amplifier having a first input coupled to receive one half the input voltage, a second input coupled to the voltage across the flying capacitor through a balance resistor, and an output coupled to the second input through a balance capacitor, wherein the delta voltage is generated at the output of the amplifier, the delta voltage having a slope that is proportional to the difference between one half the input voltage and the voltage across the flying capacitor; and wherein the second voltage-to-current converter generates the second charging current based upon the delta voltage.

16. The DC-DC converter of claim 14, further comprising balancing circuitry, the balancing circuitry comprising an amplifier having a non-inverting input coupled to receive one half the input voltage, an inverting input coupled to the voltage across the flying capacitor through a balance resistor, and an output coupled to the inverting input through a balance capacitor, wherein the delta voltage is generated at the output of the amplifier, the delta voltage having a slope that is proportional to the difference between one half the input voltage and the voltage across the flying capacitor; and wherein the second voltage-to-current converter generates the second charging current based upon the delta voltage.

* * * * *